US 7,196,580 B2

(12) United States Patent
Ryoo et al.

(10) Patent No.: US 7,196,580 B2
(45) Date of Patent: Mar. 27, 2007

(54) DIGITAL AUDIO AMPLIFIER INCLUDING PHASE LEAD-LAG COMPENSATOR FOR INCREASING SELF-OSCILLATION FREQUENCY

(75) Inventors: Tae Ha Ryoo, Daejeon (KR); Byung Tak Jang, Daejeon (KR)

(73) Assignee: DMB Technology Co., Ltd., Daejeon (KR)

( * ) Notice: Subject to any disclaimer, the term of this patent is extended or adjusted under 35 U.S.C. 154(b) by 141 days.

(21) Appl. No.: 10/530,977

(22) PCT Filed: Oct. 10, 2003

(86) PCT No.: PCT/KR03/02089

§ 371 (c)(1),
(2), (4) Date: Apr. 11, 2005

(87) PCT Pub. No.: WO2004/034577

PCT Pub. Date: Apr. 22, 2004

(65) Prior Publication Data

US 2006/0001488 A1 Jan. 5, 2006

(30) Foreign Application Priority Data

Oct. 10, 2002 (KR) ............... 10-2002-0061790

(51) Int. Cl.
*H03F 3/217* (2006.01)

(52) U.S. Cl. ................................ 330/251
(58) Field of Classification Search ............ 330/10, 330/207 A, 251
See application file for complete search history.

(56) References Cited

U.S. PATENT DOCUMENTS

| 4,464,634 | A | 8/1984 | Velazquez | 330/264 |
| 5,898,340 | A | 4/1999 | Chatterjee | 330/251 |
| 6,392,476 | B1 * | 5/2002 | Rodriguez | 330/10 |
| 2002/0097091 | A1 | 7/2002 | Takagishi | 330/251 |

FOREIGN PATENT DOCUMENTS

JP        2000-184500 A     6/2000

OTHER PUBLICATIONS

PCT International Search Report, Jan. 19, 2006.

* cited by examiner

*Primary Examiner*—Steven J. Mottola
(74) *Attorney, Agent, or Firm*—Jones Day

(57) ABSTRACT

Provided is a digital audio amplifier capable of increasing self-oscillation frequency by using a phase lead-lag compensator. The digital audio amplifier includes the phase lead-lag compensator which increases the self-oscillation frequency by lead-lag-compensating for the phase of an output signal and making a feedback of the compensated output signal. In addition, the digital audio amplifier further includes a bandwidth control means which controls the bandwidth of an error amplifier. Accordingly, the digital audio amplifier can adjust the self-oscillation frequency and reduce the extent to which the self-oscillation frequency varies in accordance with the variation of the output signal by using the bandwidth control means that inserts a pole into the error amplifier.

8 Claims, 9 Drawing Sheets

DIGITAL AUDIO AMPLIFIER INCLUDING PHASE LEAD-LAG COMPENSATOR FOR INCREASING SELF-OSCILLATION FREQUENCY

FIELD OF THE INVENTION

The present invention relates to a self oscillation-type digital audio amplifier, and more particularly, to a digital audio amplifier capable of increasing self-oscillation frequency by using a phase lead-lag compensator.

BACKGROUND OF THE INVENTION

FIG. 1 is a circuit diagram of a conventional self oscillation-type digital audio amplifier. Referring to FIG. 1, the conventional self oscillation-type digital audio amplifier includes a power PMOS transistor (PM), a power NMOS transistor (NM), a first filter 11, a second filter 12, a voltage divider 13, an error amplifier 14, a comparator 15, and a gate driver 16.

The operation of the conventional self oscillation-type digital audio amplifier of FIG. 1 will be described in the following paragraphs.

An output voltage $V_{OUT}$ is divided by the voltage divider 13 at a constant rate, and a result of the division, i.e., a feedback voltage $V_{FB}$, is compared with an input audio voltage $V_{IN}$ by the error amplifier 14. Error amplified by the error amplifier 14 is converted into a pulse signal by the comparator 15 having hysteresis. The pulse signal is transmitted to the power transistors PM and NM via the gate driver 16 and then is finally used for controlling the output voltage $V_{OUT}$.

More specifically, if the input audio voltage $V_{IN}$ is larger than the feedback voltage $V_{FB}$, the PMOS transistor PM is turned on so that the output voltage $V_{OUT}$ increases. If the output voltage $V_{OUT}$ keeps increasing until the feedback $V_{FB}$ becomes larger than the input audio voltage $V_{IN}$, the NMOS transistor NM is turned on so that the output voltage $V_{OUT}$ decreases.

The conventional self oscillation-type digital audio amplifier operates in an oscillation manner where the output voltage $V_{OUT}$ alternately increases and decreases at high speed centering around a result of amplifying the input voltage $V_{IN}$ at a predetermined rate. The output voltage $V_{OUT}$ has a waveform obtained by adding a voltage ripple generated in self-oscillation to a result of amplifying the input signal VIN having a voice bandwidth of 20 Hz~20 kHz at a predetermined rate. Here, the voltage ripple is a voltage component having an amplitude of about 100 mV and having a higher frequency than voice signals. In the meantime, since the power switches, i.e., the power transistors PM and NM, automatically operate while the conventional self oscillation-type digital audio amplifier undergoes self-oscillation, self-oscillation frequency can be simply called switching frequency.

In the conventional self oscillation-type digital audio amplifier of FIG. 1, a resistor $R_1$ and a capacitor $C_1$ in the first filter 11 are connected to each other in cascade in order to sense the variation of the output voltage $V_{OUT}$. Accordingly, the variation of voltage at the capacitor $C_1$ is proportional to the amount of current passing through the capacitor $C_1$. A difference between voltages respectively at either end of the resistor $R_1$ corresponds to the variation of the voltage at the capacitor $C_1$. Therefore, as large a waveform as the variation of the voltage at the capacitor $C_1$ can be obtained by increasing the resistance of the resistor $R_1$.

The conventional self oscillation-type digital audio amplifier can feed back the output voltage $V_{OUT}$ and its variation by sensing the variation of the voltage at the capacitor $C_1$ taking advantage of the above-described structure of the first filter 11 in which the resistor $R_1$ and the capacitor $C_1$ are connected to each other in cascade. However, a voltage ripple at the output node ($V_{OUT}$) of the capacitor $C_1$, may undesirably increase. In order to prevent this problem, excessive voltage ripples should be compensated for by connecting the first filter 11 and the second filter 12 in cascade.

Alternatively, voltage ripples at the output node ($V_{OUT}$) can be sufficiently compensated for by providing the first filter 11 without the resistor R1. In this case, however, self-oscillation frequency may dramatically decrease.

SUMMARY OF THE INVENTION

The present invention provides a self oscillation-type digital audio amplifier which is capable of increasing self-oscillation frequency by lead-lag-compensating for the phase of an output signal and making a feedback of the compensated output signal and is also capable of adjusting the self-oscillation frequency and decreasing the extent to which the self-oscillation frequency varies in accordance with the variation of the output signal by controlling the bandwidth of an error amplifier.

According to an aspect of the present invention, there is provided a digital audio amplifier. The digital audio amplifier includes a power PMOS transistor, which has a source to which a first power supply voltage is applied and a drain connected to a common node, a power NMOS transistor, which has a drain connected to the common node and a source to which a second power supply voltage is applied, an output node filter, which is connected to the common node, a phase lead-lag compensator, which lead-lag compensates for the phase of an output signal of the output node filter, an error amplifier, which compares an output signal of the phase lead-lag compensator with an input audio signal and amplifies an error between the output signal and the input audio signal, a comparator, which converts an error amplified by the error amplifier into a pulse signal, and a gate driver, which controls a gate of the power PMOS transistor and a gate of the power NMOS transistor in response to the pulse signal. Here, the phase lead-lag compensator increases self-oscillation frequency by lead-lag-compensating for the phase of the output signal of the output node filter.

Preferably, the digital audio amplifier further includes a bandwidth control means, which adjusts the bandwidth of the error amplifier.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE PREFERRED EMBODIMENTS

Hereinafter, the present invention will be described more fully with reference to the accompanying drawings in which preferred embodiments of the invention are shown.

Figure 2:
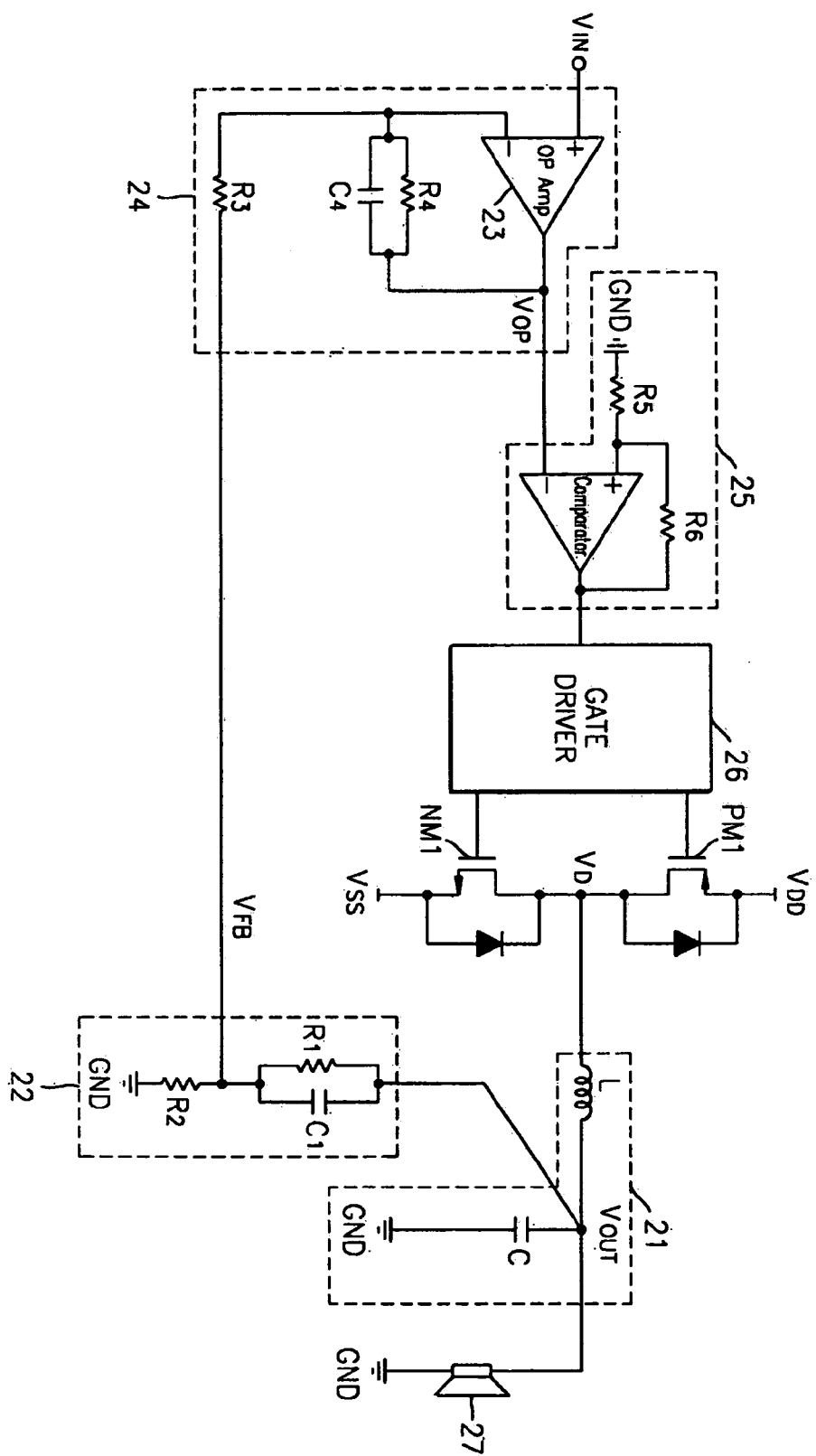
FIG. 2 is a circuit diagram of a self oscillation-type digital audio amplifier according to a preferred embodiment of the present invention.

FIG. 2 is a circuit diagram of a self oscillation-type digital audio amplifier according to a preferred embodiment of the present invention. Referring to FIG. 2, the self oscillation-type digital audio amplifier includes a power PMOS transistor PM1, a power NMOS transistor NM1, an output node filter 21, a phase lead-lag compensator 22, an error amplifier 24, a comparator 25, and a gate driver 26. A speaker 27 is connected to the output node filter 21.

A first power supply voltage $V_{DD}$, i.e., a positive power supply voltage, is applied to the source of the power PMOS transistor PM1, and a common node $V_D$ is connected to the drain of the power PMOS transistor PM1. On the other hand, the common node $V_D$ is connected to the drain of the power NMOS transistor NM1, and a second power supply voltage Vss, i.e., a negative power supply voltage, is applied to the source of the power NMOS transistor NM1.

The output node filter 21 is connected to the common node $V_D$, and a final output signal $V_{OUT}$ of the self oscillation-type digital audio amplifier is output from the output node filter 21. The output node filter 21 includes an inductor L provided between the common node $V_D$ and an output node $V_{OUT}$ of the output node filter 21 and a capacitor C provided between the output node $V_{OUT}$ of the output node filter 21 and ground voltage GND.

The phase lead-lag compensator 22 lead-lag compensates the phase of the output signal $V_{OUT}$ received from the output node filter 21 and then outputs a result of the lead-lag compensation. The phase lead-lag compensator 22 includes a first resistor $R_1$ provided between the output node of the output node filter 21 and the output node of the phase lead-lag compensator 22, a capacitor $C_1$ connected to the first resistor $R_1$ in parallel, and a second resistor $R_2$ provided between the an output node of the phase lead-lag compensator 22 and the ground voltage GND.

The error amplifier 24 compares an output signal $V_{FB}$ of the phase lead-lag compensator 22 with an input audio signal $V_{IN}$ and amplifies an error between the output signal $V_{FB}$ and the input audio signal $V_{IN}$. The comparator 25 converts the amplified error received from the error amplifier 24 into a pulse signal, and the gate driver 26 controls the gate of the power PMOS transistor PM1 and the gate of the power NMOS transistor NM1 in response to the pulse signal.

Figure 1:
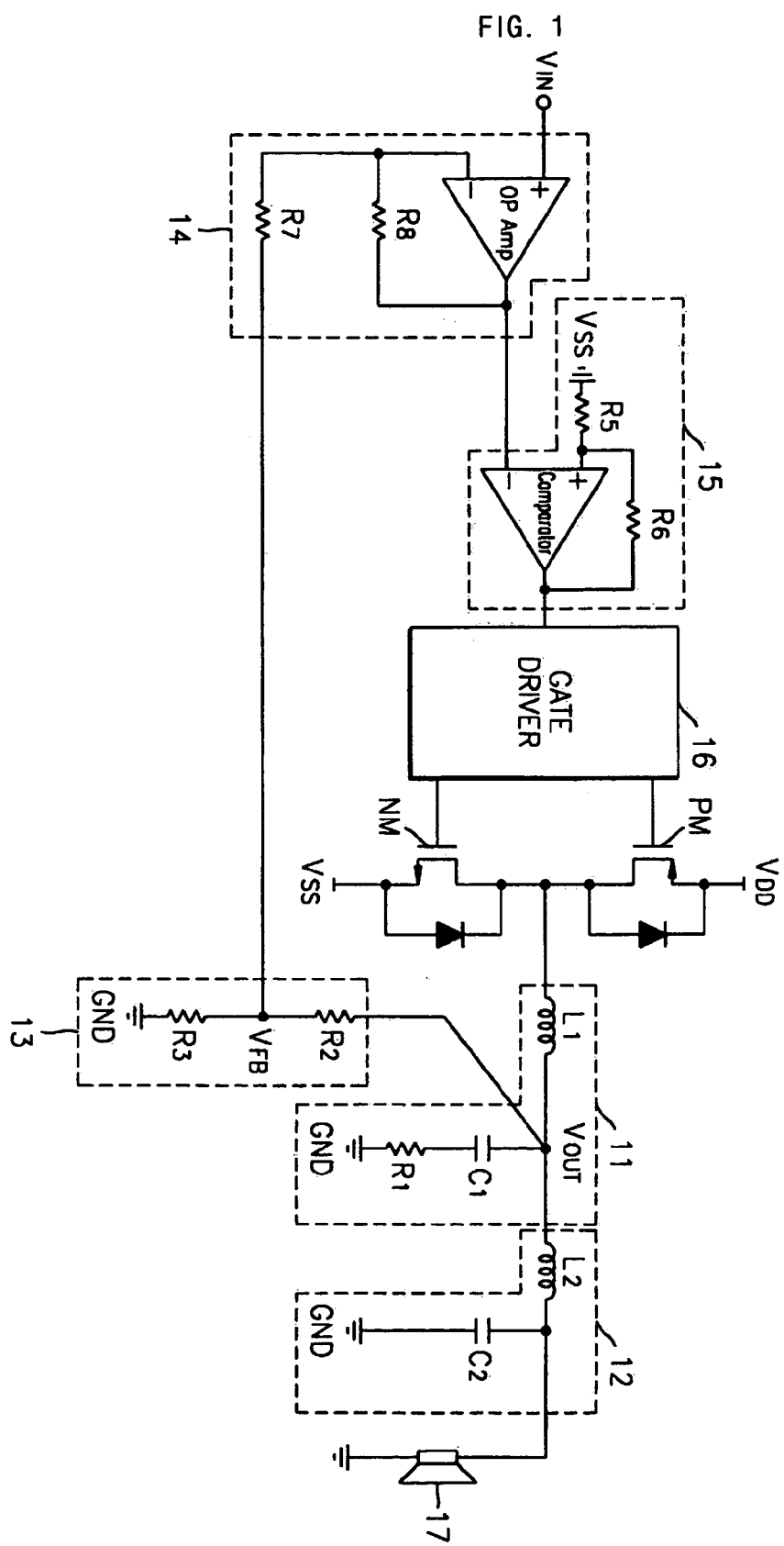
FIG. 1 is a circuit diagram of a conventional self oscillation-type digital audio amplifier.

The error amplifier 24 includes an operational amplifier whose output node is connected to an input node of the comparator 25 and whose first input node is connected to the input audio signal $V_{IN}$, a third resistor $R_3$ provided between an output node $V_{FB}$ of the phase lead-lag compensator 22 and a second input node of the operational amplifier 23, a fourth resistor $R_4$ provided between the second input node of the operational amplifier 23 and an output node $V_{OP}$, and a capacitor $C_4$ connected to the fourth resistor $R_4$ in parallel. Functions of the error amplifier 24 whose bandwidth is limited are determined by the capacitor $C_4$. In other words, a pole is generated at a predetermined frequency at which the capacitor $C_4$ and the fourth resistor $R_4$ have the same impedance. Hereinafter, the operation of the self oscillation-type digital audio amplifier according to the present invention, shown in FIG. 2, will be described in greater detail. In principle, an oscillator oscillates at a predetermined frequency that provides a phase delay of a total of 360 degrees and a gain of 1 or larger in an entire feedback loop. The self-oscillation frequency can be increased by increasing the phase margin of the feedback loop. From a phase's point of view, the conventional self oscillation-type digital audio amplifier of FIG. 1 increases its phase margin by inserting the cascade resistor $R_1$ into the capacitor $C_1$, while the self oscillation-type digital audio amplifier according to the present invention increases its phase margin by using the phase lead-lag compensator 22.

Figure 3:
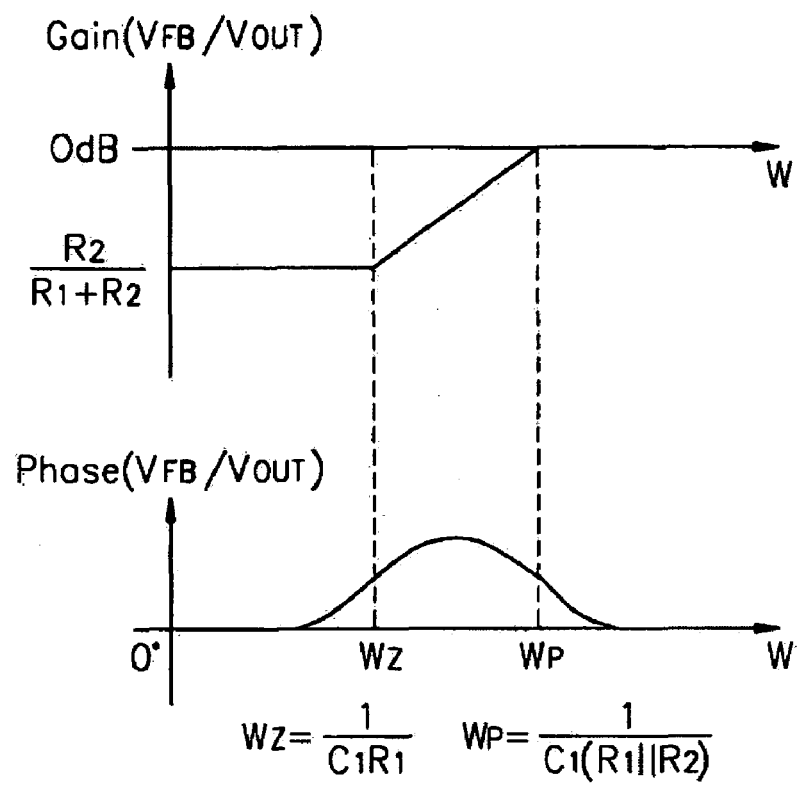
FIG. 3 is a diagram illustrating the variation of gain and phase delay in accordance with frequency of a phase lead-lag compensator of FIG. 2.

FIG. 3 is a diagram illustrating the variation of gain and phase delay depending on frequency of the phase lead-lag compensator 22 of FIG. 2. The phase lead-lag compensator 22 can compensate for phase delay generated at the output node filter 21. According to the frequency characteristics of the phase lead-lag compensator 22, a zero point is created by the first resistor $R_1$ and the capacitor $C_1$, and gain increases. If the frequency of the phase lead-lag compensator 22 increases during a phase lead, the gain stops increasing due to a pole created by the capacitor $C_1$ and the first and second resistors $R_1$ and $R_2$ connected to each other in parallel, and the phase lead decreases. Then, the original phase is recovered at a frequency 10 times higher than the pole.

Therefore, phase margin can be generated at frequencies between the zero point and the pole by leading the output node filter 21. The phase margin indicates that phase delay caused by the error amplifier 24 and the comparator 25 may possibly increase. The phase margin increases self-oscillation frequency.

Figure 4:
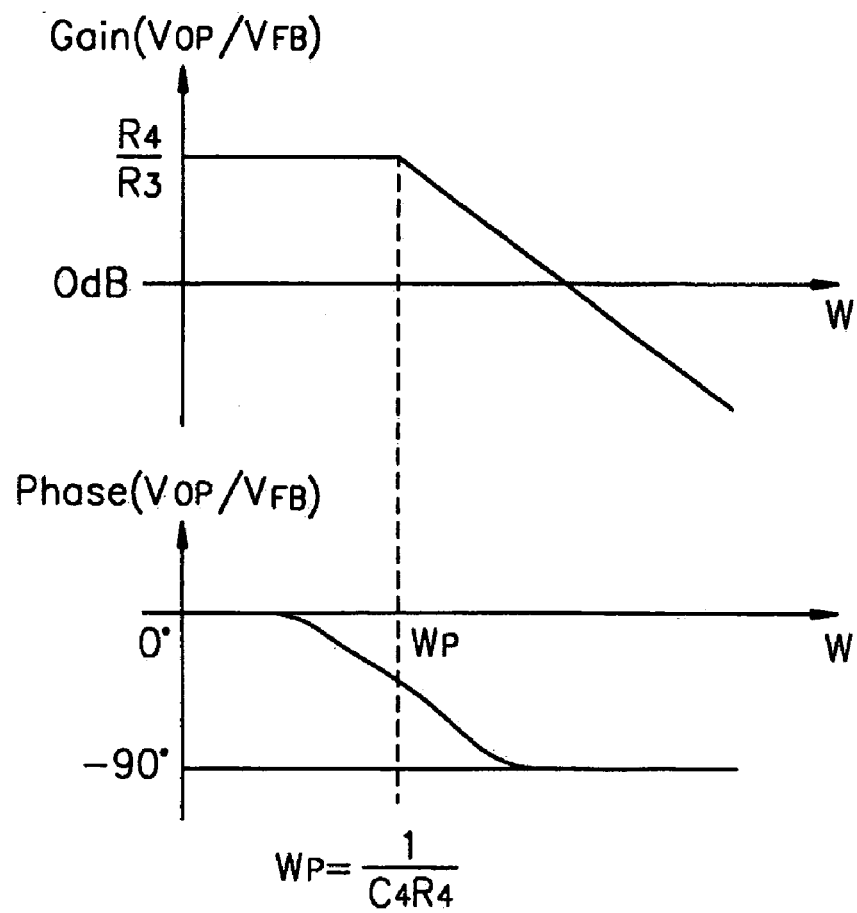
FIG. 4 is a diagram illustrating limiting of amplification frequency bandwidth by using a bandwidth control means that inserts a pole into an error amplifier of FIG. 2.

FIG. 4 is a diagram illustrating limiting of amplification frequency bandwidth by using the bandwidth control means $C_4$ that inserts a pole into the error amplifier 24. The error amplifier 24 into which a pole is inserted maintain uniform gain at frequencies lower than the pole but has decreasing gain and lengthened phase delay at frequencies higher than the pole. If the pole moves within the phase variation bandwidth of the phase lead-lag compensator 22, phase delay of the entire feedback loop varies at self-oscillation frequency or so, and accordingly, the self-oscillation frequency itself varies. The error amplifier 24 into which the pole is inserted may possibly be seen as an amplifier whose operation bandwidth is limited.

Figure 5:
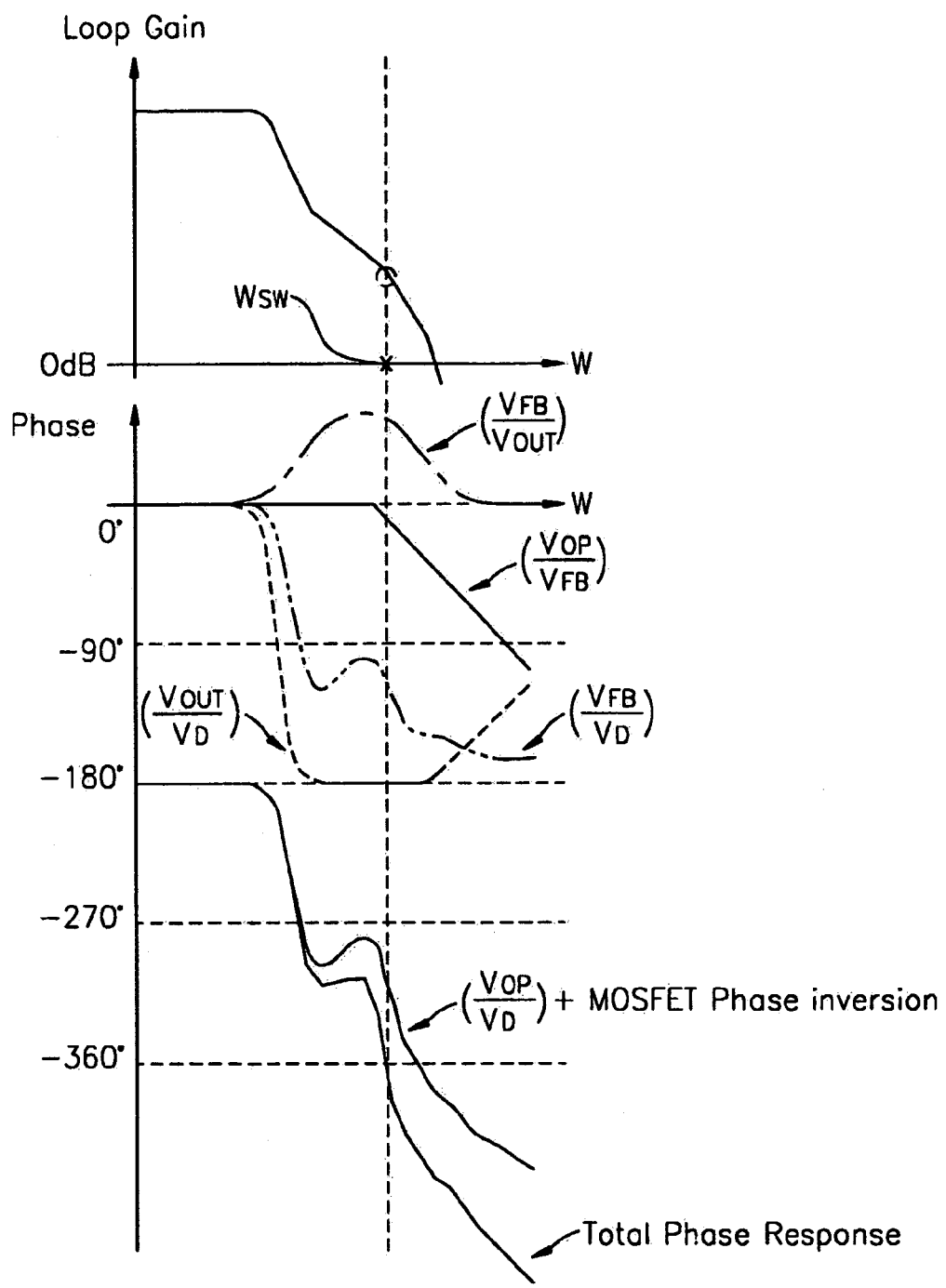
FIG. 5 is a diagram illustrating the frequency characteristics of an entire feedback loop in the self oscillation-type digital audio amplifier of FIG. 2.

FIG. 5 is a diagram illustrating the frequency characteristics of an entire feedback loop in a self oscillation-type digital audio amplifier according to a preferred embodiment of the present invention. A low pass filter, i.e., the output node filter 21 of FIG. 2, which is an secondary inductor-capacitor filter, removes self-oscillation frequency components whose frequency is higher than that of the input audio signal $V_{IN}$ from a signal output from the common node VD of the power MOS transistors PM1 and NM1. In the output node filter 21, the gain of a voltage component whose frequency is higher than self-oscillation frequency (f)

decreases to 40 dB/dec, and the phase of the voltage component is delayed by as much as 180 degrees. Here, $$f = \frac{1}{2\pi\sqrt{LC}} \cong 20 \text{ kHz}.$$

However, if the frequency of the voltage component further increases, a zero point is created due to parasitic resistance existing in the capacitor C, and a phase lead occurs. Since it is generally generated at a frequency of several MHz or higher, the zero point is almost ignored.

The output signal $V_{OUT}$ of the output node filter 21 is converted into the feedback signal $V_{FB}$ after its amplitude is decreased and its phase is led by the phase lead-lag compensator 22. The error amplifier 24 compares the feedback signal $V_{FB}$ with the input audio signal $V_{IN}$, input from the outside of the self oscillation-type digital audio amplifier of FIG. 2, and amplifies a difference between the feedback signal $V_{FB}$ and the input audio signal $V_{IN}$.

While signals travel along the feedback loop in the self oscillation-type digital audio amplifier of FIG. 2, phase delay additionally occurs in the comparator 25 and the gate driver 26. In the power MOS transistors PM1 and NM1, in particular, phase inversion occurs, and accordingly, a phase delay of 180 degrees occurs. Finally, the self oscillation-type digital audio amplifier of FIG. 2 starts oscillating at a predetermined frequency where a total phase delay of 360 degrees can be obtained with a loop gain of 1 or larger. Gain and phase delay can be adjusted by using the phase lead-lag compensator 22 and the error amplifier. If a self oscillation-type digital audio amplifier includes the output node filter 21 without the phase lead-lag compensator 22, self-oscillation frequency remains at several tens of kHz. On the other hand, if the self oscillation-type digital audio amplifier, like the one shown in FIG. 2, includes the phase lead-lag compensator 22 as well as the output node filter 21, the self-oscillation frequency increases to several hundreds of kHz.

In FIGS. 3 through 5, frequency (W) and gain (Gain) are represented using a log scale.

In a self oscillation-type digital audio amplifier, self-oscillation frequency decreases as output voltage increases. If bandwidth is limited by inserting a pole into the error amplifier 24 using the bandwidth control means $C_4$, the extent to which the self-oscillation frequency varies in accordance with the variation of the output voltage can be reduced. In other words, if the self-oscillation frequency decreases, the error amplifier 24 increases gain and decreases phase delay. On the other hand, if the self-oscillation frequency increases, the error amplifier 24 decreases the gain and increases the phase delay. By dong so, the error amplifier 24 can prevent fluctuations in the self-oscillation frequency in accordance with the variation of the output voltage.

Figure 6:
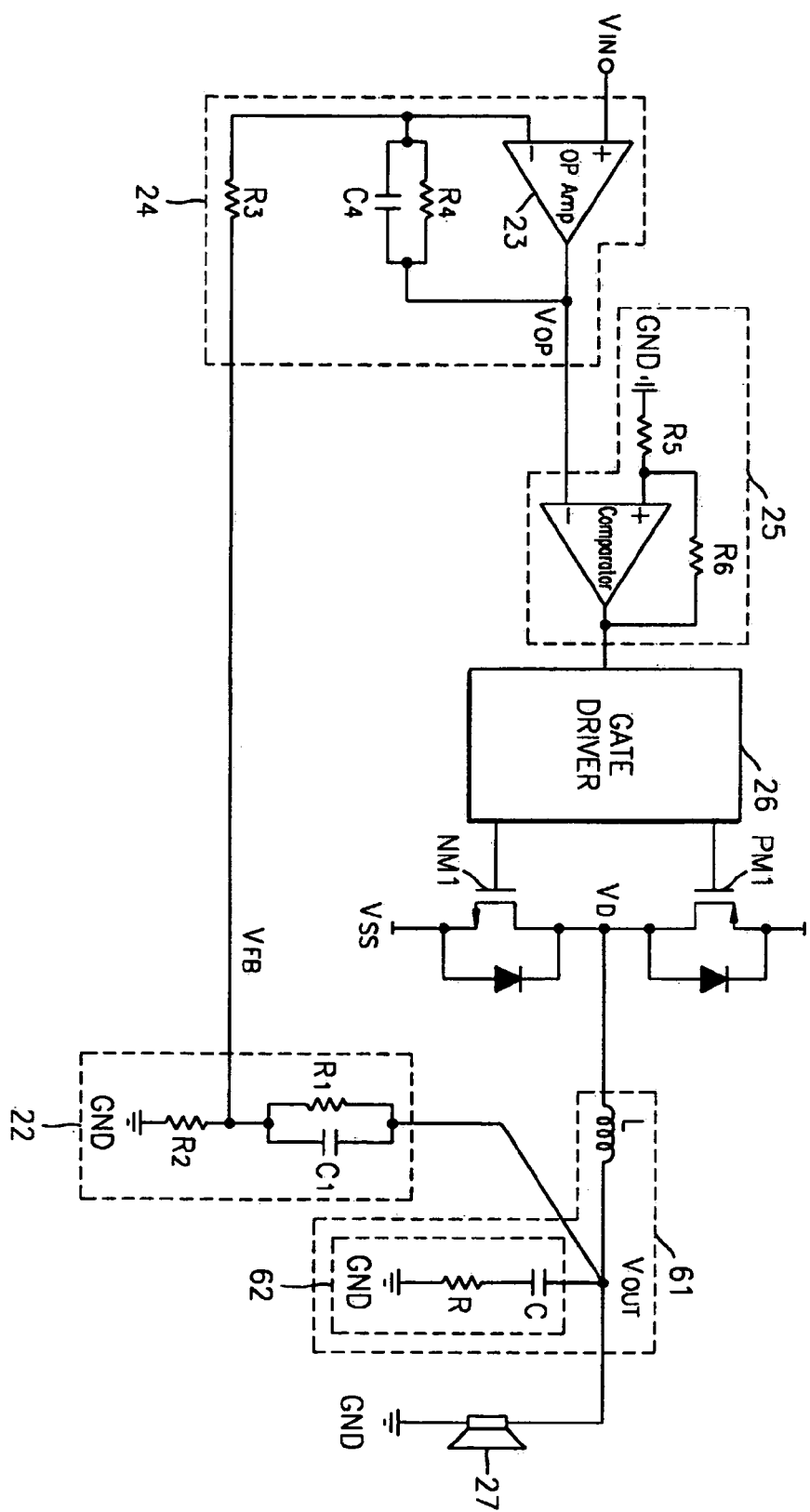
FIG. 6 is a circuit diagram of a self oscillation-type digital audio amplifier according to a second embodiment of the present invention.

FIG. 6 is a circuit diagram of a self oscillation-type digital audio amplifier according to another preferred embodiment of the present invention. Referring to FIG. 6, the self oscillation-type digital audio amplifier, like the self oscillation-type digital audio amplifier of FIG. 2, includes a power PMOS transistor PM1, a power NMOS transistor NM1, a phase lead-lag compensator 22, an error amplifier 24, a comparator 25, a gate driver 26, and a speaker 27. In addition, the self oscillation-type digital audio amplifier further includes an output node filter 61 in which, unlike in the output node filter 21 of FIG. 2, a resistor R is provided between a capacitor C and ground voltage GND.

In the present embodiment, self-oscillation frequency of an entire feedback loop increases due to the existence of the resistor R in the output node filter 61. More specifically, due to the resistor R connected to the capacitor C in cascade, a zero point created due to parasitic resistance ESR and the capacitor C moves down so that phase delay occurring in the output node filter 61 decreases and phase margins in the error amplifier 24, the comparator 25, and the gate driver 26 increase. Accordingly, the self oscillation-type digital audio amplifier can oscillate at higher frequency.

Figure 7:
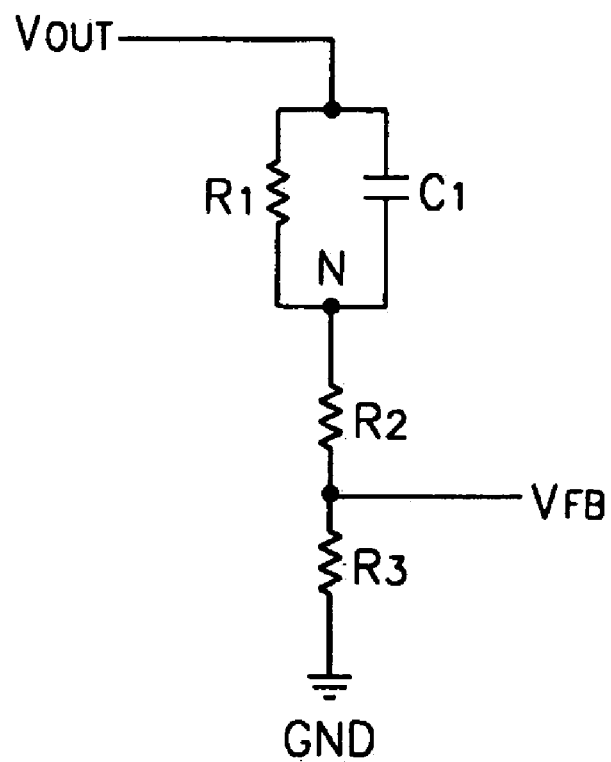
FIGS. 7 through 9 are circuit diagrams of different examples of the phase lead-lag compensator of FIG. 2 or 6.
Figure 8:
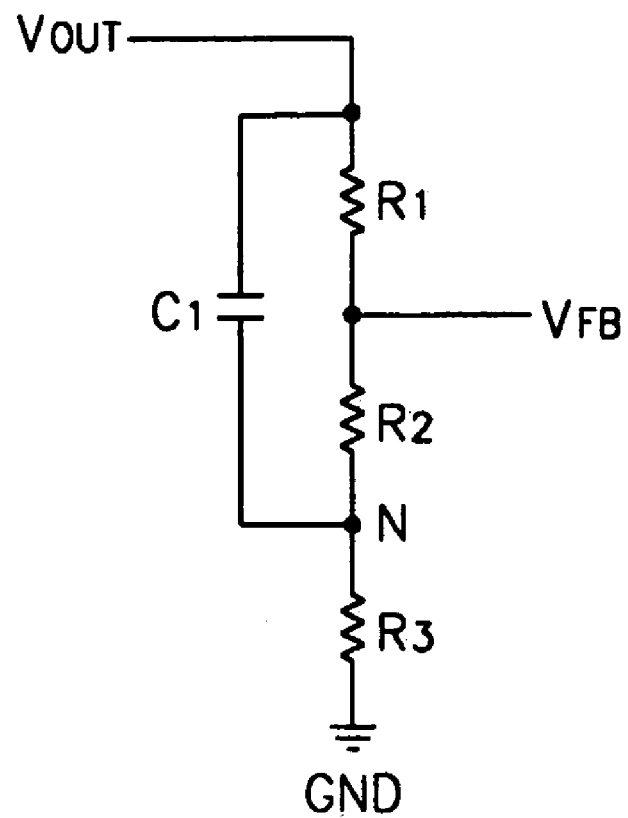
Figure 9:
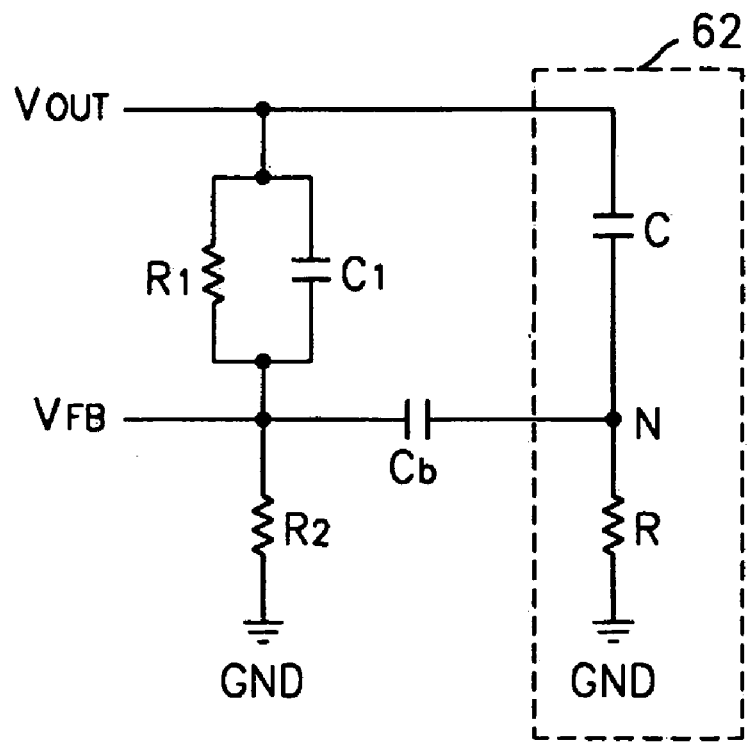

FIGS. 7 through 9 are diagrams illustrating different examples of the phase lead-lag compensator 22 of FIG. 2 or 6.

Referring to FIG. 7, a phase lead-lag compensator includes a resistor $R_1$ provided between an output node $V_{OUT}$ of an output node filter and an inner node N, a capacitor $C_1$ connected to the resistor $R_1$ in parallel between the output node $V_{OUT}$ and the inner node N, a resistor $R_2$ provided between an output node $V_{FB}$ of the phase lead-lag compensator and the inner node N, and a resistor $R_3$ provided between the output node $V_{FB}$ of the phase lead-lag compensator and ground voltage GND.

Referring to FIG. 8, a phase lead-lag compensator includes a resistor $R_1$ provided between an output node $V_{OUT}$ of an output node filter and an output node $V_{FB}$ of the phase lead-lag compensator, a resistor $R_2$ provided between the output node $V_{FB}$ of the phase lead-lag compensator and an inner node N, a resistor $R_3$ provided between the inner node N and ground voltage GND, and a capacitor $C_1$ provided between the output node $V_{OUT}$ of the output node filter and the inner node N.

Referring to FIG. 9, a phase lead-lag compensator includes a resistor $R_1$ provided between an output node $V_{OUT}$ of an output node filter 62 and an output node $V_{FB}$ of the phase lead-lag compensator, a capacitor $C_1$ connected to the resistor $R_1$ in parallel between the output node $V_{OUT}$ of the output node filter 62 and the output node $V_{FB}$ of the phase lead-lag compensator, a resistor $R_2$ provided between the output node $V_{FB}$ of the phase lead-lag compensator and ground voltage GND, and a capacitor $C_b$ provided between the output node $V_{FB}$ of the phase lead-lag compensator and a connection node N between a capacitor C and a resistor R in the output node filter 62.

While the present invention has been particularly shown and described with reference to exemplary embodiments thereof, it will be understood by those of ordinary skill in the art that various changes in form and details may be made therein without departing from the spirit and scope of the present invention as defined by the following claims.

As described above, the self oscillation-type digital audio amplifieraccording to the present invention is capable of increasing self-oscillation frequency by lead-lag-compensating for the phase of an output signal and making a feedback of the compensated output signal, and is also capable of adjusting the self-oscillation frequency and reducing the extent to which the self-oscillation frequency varies in accordance with the variation of the output signal by controlling the bandwidth of an error amplifier, i.e., by inserting a pole into the error amplifier.

What is claimed is:

1. A digital audio amplifier comprising:
   a power PMOS transistor which has a source to which a first power supply voltage is applied and a drain connected to a common node;
   a power NMOS transistor which has a drain connected to the common node and a source to which a second power supply voltage is applied;

an output node filter which is connected to the common node;

a phase lead-lag compensator which lead-lag compensates for the phase of an output signal of the output node filter;

an error amplifier which compares an output signal of the phase lead-lag compensator with an input audio signal and amplifies an error between the output signal and the input audio signal;

a comparator which converts an error amplified by the error amplifier into a pulse signal; and a gate driver which controls a gate of the power PMOS transistor and a gate of the power NMOS transistor in response to the pulse signal, wherein the phase lead-lag compensator increases self-oscillation frequency by lead-lag-compensating for the phase of the output signal of the output node filter.

2. The digital audio amplifier of claim 1 further comprising a bandwidth control means which adjusts the bandwidth of the error amplifier.

3. The digital audio amplifier of claim 1, wherein the phase lead-lag compensator comprises:

a first resistor which is provided between an output node of the output node filter and an output node of the phase lead-lag compensator;

a capacitor which is connected to the first resistor in parallel between the output node of the output node filter and the output node of the phase lead-lag compensator; and a second resistor which is provided between the output node of the phase lead-lag compensator and ground voltage.

4. The digital audio amplifier of claim 1, wherein the phase lead-lag compensator comprises:

a first resistor which is provided between an output node of the output node filter and an inner node;

a capacitor which is connected to the first resistor in parallel between the output node of the output node filter and the inner node;

a second resistor which is provided between the inner node and an output node of the phase lead-lag compensator; and a third resistor which is provided between the output node of the phase lead-lag compensator and ground voltage.

5. The digital audio amplifier of claim 1, wherein the phase lead-lag compensator comprises:

a first resistor which is provided between an output node of the output node filter and an output node of the phase lead-lag compensator;

a second resistor which is provided between the output node of the phase lead-lag compensator and an inner node;

a third resistor which is provided between the inner node and ground voltage; and a capacitor which is provided between the output node of the output node filter and the inner node.

6. The digital audio amplifier of claim 2, wherein the error amplifier comprises:

an operational amplifier which has an output node connected to an input node of the comparator and a first input node connected to the input audio signal;

a first resistor which is provided between an output node of the phase lead-lag compensator and a second input node of the operational amplifier;

a second resistor which is provided between the second input node of the operational amplifier and the output node of the operational amplifier; and a capacitor which is connected to the second resistor in parallel between the second input node and output node of the operational amplifier.

7. The digital audio amplifier of claim 1, wherein the output node filter comprises:

an inductor which is provided between the common node and an output node of the output node filter;

a first capacitor one end of which is connected to the output node of the output node filter; and a first resistor which is provided between the other end of the first capacitor and ground voltage.

8. The digital audio amplifier of claim 7, wherein the phase lead-lag compensator comprises:

a second resistor which is provided between the output node of the output node filter and the output node of the phase lead-lag compensator;

a second capacitor which is connected to the second resistor in parallel between the output node of the output node filter and the output node of the phase lead-lag compensator;

a third resistor which is provided between the output node of the phase lead-lag compensator and the ground voltage; and a third capacitor which is provided between the output node of the phase lead-lag compensator and the other end of the first capacitor.

* * * * *